United States Patent
Rahman

(10) Patent No.: US 8,560,982 B2
(45) Date of Patent: Oct. 15, 2013

(54) INTEGRATED CIRCUIT DESIGN USING THROUGH SILICON VIAS

(75) Inventor: Arifur Rahman, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 221 days.

(21) Appl. No.: 13/170,020

(22) Filed: Jun. 27, 2011

(65) Prior Publication Data

US 2012/0331435 A1   Dec. 27, 2012

(51) Int. Cl.
*G06F 17/50* (2006.01)

(52) U.S. Cl.
USPC ........... 716/100; 716/110; 716/119; 257/773; 438/667

(58) Field of Classification Search
USPC ......... 716/100–105, 110, 118–125, 132, 135; 438/126, 667; 257/621, 773–778
See application file for complete search history.

(56) References Cited

U.S. PATENT DOCUMENTS

| 8,082,537 | B1 | 12/2011 | Rahman |
|---|---|---|---|
| 2009/0079071 | A1 | 3/2009 | Webb |
| 2010/0257495 | A1* | 10/2010 | Wu ................................ 716/5 |
| 2010/0270597 | A1 | 10/2010 | Sproch et al. |
| 2011/0073917 | A1 | 3/2011 | Zhong et al. |
| 2011/0095367 | A1 | 4/2011 | Su et al. |

OTHER PUBLICATIONS

U.S. Appl. No. 13/162,541, filed Jun. 16, 2011, Rahman.
Vandevelde, Bart et al., "Thermo-mechanics of 3D-wafer level and 3D stacked IC packaging technologies," *2008 IEEE International Conference on Thermal, Mechanical and Multi-Physics Simulation and Experiments in Microelectronics and Micro-Systems*, Apr. 20, 2008, pp. 1-7, IEEE, Piscataway, New Jersey, USA.

\* cited by examiner

*Primary Examiner* — Paul Dinh
(74) *Attorney, Agent, or Firm* — Kevin T. Cuenot; LeRoy D. Maunu; Lois D. Cartier

(57) ABSTRACT

A method of integrated circuit design using through silicon vias (TSVs) can include determining that a stress field to which a first active circuit element of a circuit block is exposed and a stress field to which a second active circuit element of the circuit block is exposed are mismatched. Mismatch between the stress field of the first active circuit element and the stress field of the second active circuit element can be reduced by modifying a layout of the die for a TSV.

8 Claims, 5 Drawing Sheets

INTEGRATED CIRCUIT DESIGN USING THROUGH SILICON VIAS

FIELD OF THE INVENTION

One or more embodiments disclosed within this specification relate to integrated circuits (ICs). More particularly, one or more embodiments relate to designing an IC using through silicon vias.

BACKGROUND

Integrated circuits (ICs) can be implemented using multiple dies. A circuit design that otherwise would be implemented using a single, larger die can be implemented using a multi-die IC structure. A multi-die IC structure is typically characterized by the inclusion of two or more dies coupled to one another and placed within a single IC package. The circuit design is implemented across the multiple dies in lieu of using an IC structure having a single, larger die.

In order to implement a circuit design using a multi-die IC structure, the circuit design must be partitioned across the dies of the multi-die IC structure. The partitioning process assigns circuit elements of the circuit design to the various dies of the multi-die IC structure. The partitioning process necessarily generates one or more inter-die signals. Inter-die signals refer to those signals that are exchanged between different dies of the multi-die IC structure.

One way of establishing communications between dies and from the dies to the IC package is to utilize a structure referred to as a "through silicon via" (TSV). Each TSV can be characterized as a vertical conductive path that extends through a die of the multi-die IC structure. Each TSV can be used to electrically couple a node on a top surface of the die through which the TSV extends with a different node on a bottom surface of the same die. For example, a TSV can be used to couple a node of a first die located above a second die including the TSV with a node of a third die located below the second die or a node of the IC package located below the second die.

SUMMARY

One or more embodiments disclosed within this specification relate to integrated circuits (ICs) and, more particularly, to designing an IC using through silicon vias (TSVs).

An embodiment can include a method of integrated circuit design using TSVs. The method can include determining, using a processor, that a stress field to which a first active circuit element of a circuit block is exposed and a stress field to which a second active circuit element of the circuit block is exposed are mismatched. The method can include reducing mismatch between the stress field of the first active circuit element and the stress field of the second active circuit element by modifying a layout of the die for a TSV.

In one aspect, reducing mismatch can include adjusting a location of the TSV, wherein the TSV contributes to the stress field of either the first active circuit element or the second active circuit element. For example, adjusting a location of the TSV can include adjusting a location of the TSV creating a symmetric TSV and circuit block configuration.

In another aspect, reducing mismatch can include adding a dummy TSV within a predetermined distance of the first active circuit element. For example, adding a dummy TSV can include adding the dummy TSV creating a symmetric TSV and circuit block configuration. In another example, adding a dummy TSV can include adding the dummy TSV generating an additional stress field that overlaps with the stress field of the first active circuit element.

Determining that the stress field to which the first active circuit element is exposed and the stress field to which the second active circuit element is exposed are mismatched can include determining mismatch according to symmetry of the circuit block with respect to the TSV. Additionally or alternatively, determining that the stress field to which the first active circuit element is exposed and the stress field to which the second active circuit element is exposed are mismatched can include determining mismatch according to distance of the TSV to the first active circuit element and the second active circuit element.

Another embodiment can include a system for circuit design using TSVs. The system can include a memory having program code and a processor coupled to the memory. The processor, upon executing the program code, can be configured to perform a plurality of operations. The operations can include determining that a stress field to which a first active circuit element of a circuit block is exposed and a stress field to which a second active circuit element of the circuit block is exposed are mismatched, and reducing mismatch between the stress field of the first active circuit element and the stress field of the second active circuit element by modifying a layout of the die for a TSV.

Reducing mismatch can include adjusting a location of the TSV, wherein the TSV contributes to the stress field of either the first active circuit element or the second active circuit element. For example, adjusting a location of a TSV can include adjusting a location of the TSV creating a symmetric TSV and circuit block configuration.

Additionally or alternatively, reducing mismatch can include adding a dummy TSV within a predetermined distance of the first active circuit element. Adding a dummy TSV, for example, can include adding the dummy TSV creating a symmetric TSV and circuit block configuration. In another example, adding the dummy TSV can include adding the dummy TSV thereby generating an additional stress field that overlaps with the stress field of the first active circuit element.

Determining that the stress field to which the first active circuit element is exposed and the stress field to which the second active circuit element is exposed are mismatched can include determining mismatch according to symmetry of the circuit block and the TSV. Additionally or alternatively, determining that the stress field to which the first active circuit element is exposed and the stress field to which the second active circuit element is exposed are mismatched can include determining mismatch according to distance of the TSV to the first active circuit element and the second active circuit element.

Another embodiment can include a device that includes a non-transitory data storage medium usable by a system that has a processor and a memory. The data storage medium can store program code that, when executed by the system, causes the system to execute operations. The operations can include determining that a stress field to which a first active circuit element of a circuit block is exposed and a stress field to which a second active circuit element of the circuit block is exposed are mismatched, and reducing mismatch between the stress field of the first active circuit element and the stress field of the second active circuit element by modifying a layout of the die for a TSV.

Reducing mismatch can include adjusting a location of the TSV, wherein the TSV contributes to the stress field of either the first active circuit element or the second active circuit element. Adjusting a location of a TSV can include adjusting a location of the TSV creating a symmetric TSV and circuit block configuration. Reducing mismatch can include adding a dummy TSV within a predetermined distance of the first active circuit element.

DETAILED DESCRIPTION

Figure 1:
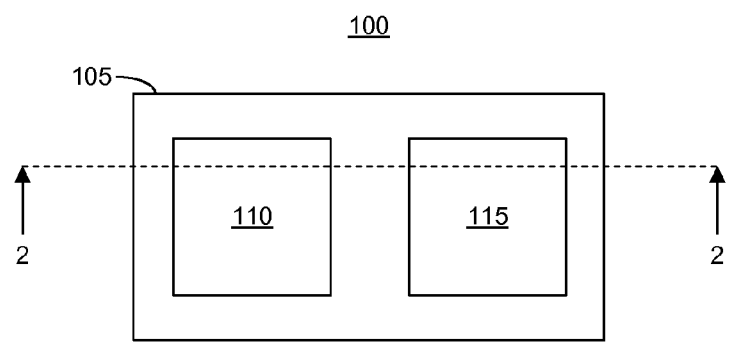
FIG. 1 is a first block diagram illustrating a topographic view of a multi-die integrated circuit (IC) structure in accordance with an embodiment disclosed within this specification.

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to designing an IC using through silicon vias (TSVs). The use or inclusion of TSVs within an IC can have an effect upon the performance of the circuitry implemented therein. The inclusion of a TSV, for example, can induce or generate a stress field within the particular die within which the TSV is implemented. The stress field induced by the TSV can influence the performance of an active circuit element and, thus, by extension, more complex circuits or circuit blocks built using active circuit elements such as transistors. The performance of the active circuit element, as influenced by the stress field induced by a TSV proximate to the active circuit element, for example, typically differs and is degraded compared to the performance of the active circuit element in the absence of the TSV.

In accordance with the one or more embodiments disclosed within this specification, the positioning or location of one or more TSVs in terms of the physical layout (layout) of circuitry on a given die can be determined to achieve improved operating characteristics of the circuit blocks of the circuit design. For example, the performance of a circuit block such as a differential transistor pair, which is routinely used as a building block within electronic circuits, can be affected by the presence or proximity of one or more TSVs. The positioning of one or more TSVs located within a given region surrounding the circuit block can be adjusted to ensure that one or more selected operating characteristics of each active circuit element of the circuit block is affected uniformly by stress fields induced by the TSV or TSVs.

A particular placement of TSVs with respect to a differential transistor pair type of circuit block, for example, can result in each transistor of that circuit block being affected by the stress fields of the TSVs in a substantially uniform manner. Thus, characteristics such as drive current and delay of the circuit block can remain largely unaffected by the presence of the TSV or TSVs, as the case may be, since stress fields induced by the TSV(s) that can influence operation of individual active circuit elements of the circuit block affect each such active circuit element in a same or similar manner.

FIG. 1 is a first block diagram illustrating a topographic view of a multi-die IC structure (IC structure) 100 in accordance with an embodiment disclosed within this specification. In one aspect, IC structure 100 illustrates a packing approach to stacking multiple dies of an IC within a single package. IC structure 100 can include a silicon interposer (interposer) 105, a die 110, and a die 115.

Interposer 105 can be a die having a planar surface on which dies 105 and 110 can be horizontally stacked. As shown, dies 105 and 110 can be located on the planar surface of interposer 105 side-by-side. Although implemented with two horizontally stacked dies within FIG. 1, IC structure 100 also can be implemented with more than two dies being horizontally stacked. In another embodiment, die 115 can be stacked vertically on top of die 110. In still another embodiment, interposer 105 can be used as an intermediate layer between two vertically stacked dies. In that case, interposer 105 can isolate vertically stacked dies from one another within a multi-die IC package.

Interposer 105 can provide a common mounting surface and electrical coupling point for two or more dies of a multi-die IC structure. Interposer 105 can serve as an intermediate layer for interconnect routing between dies or as a ground or power plane for IC structure 100. Interposer 105 can be implemented with a silicon wafer substrate, whether doped or un-doped with an N-type and/or a P-type impurity. The manufacturing of interposer 105 can include one or more additional process steps that allow the deposition of one or more layer(s) of metal interconnect. These metal interconnect layers can include aluminum, gold, copper, nickel, various silicides, and/or the like.

Interposer 105 can be manufactured using one or more additional process steps that allow the deposition of one or more dielectric or insulating layer(s) such as, for example, silicon dioxide. In addition, interposer 105 can be manufactured using one or more additional process steps that allow the creation of active circuit elements such as, for example, transistor devices and/or diode devices. As noted, interposer 105 is, in general, a die and is characterized by the presence of one or more TSVs as will be described in greater detail within this specification.

Figure 2:
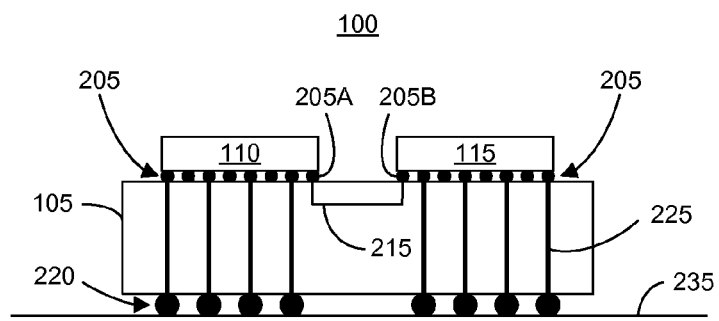
FIG. 2 is a second block diagram illustrating a cross-sectional side view of a multi-die IC structure in accordance with another embodiment disclosed within this specification.

FIG. 2 is a second block diagram illustrating a cross-sectional side view of a multi-die IC structure in accordance with another embodiment disclosed within this specification. More particularly, FIG. 2 illustrates a view of IC structure 100 of FIG. 1 taken along cut-line 2-2. As such, like numbers will be used to refer to the same items throughout this specification.

Referring to FIG. 2, each of dies 110 and 115 can be electrically coupled to interposer 105 via solder bumps 205. In addition, each of solder bumps 205 can serve to physically attach dies 110 and 115 to interposer 105. Through solder bumps 205, for example, interposer 105 is coupled to die 110. Similarly, through solder bumps 205, die 115 is coupled to interposer 105.

Although the coupling of dies 110 and 115 to interposer 105 is accomplished through solder bumps 205, a variety of other techniques can be used to couple interposer 105 to dies 110 and 115. For example, bond wires or edge wires can be used to couple dies 110 and 115 to interposer 105. In another example, an adhesive material can be used to physically attach dies 110 and 115 to interposer 105. As such, the coupling of dies 110 and 115 to interposer 105 via solder bumps 205, as illustrated within FIG. 2, is provided for purposes of illustration and is not intended to limit the one or more embodiments disclosed within this specification.

Interconnect material within interposer 105 can be used to pass inter-die signals between dies 110 and 115. For example, interconnect 215 can be coupled to each of solder bumps 205A and 205B to couple die 110 to die 115, thereby allowing the exchange of inter-die signals between dies 110 and 115. In addition, interposer 105 can be implemented with multiple conductive layers that can be coupled together with vias (not shown). In that case, interconnect 215 can be implemented within two or more conductive layers coupled together using vias within interposer 105. The use of multiple conductive layers to implement interconnects within interposer 105 allows a greater number of signals to be routed and more complex routing of signals to be achieved within interposer 105.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Solder bumps 220 can be used to electrically couple interposer 105 to a surface 235. Surface 235 can represent, for example, a multi-die IC package in which IC structure 100 is implemented. Solder bumps 220 further can couple IC structure 100 directly to a node external to the multi-die IC package. For example, solder bumps 220 can be used to physically attach interposer 105 to surface 235. TSVs 225 represent vias that, when filled with conductive material, form an electrical connection that vertically transverses, e.g., extends through a substantial portion, if not the entirety of, interposer 105.

TSVs 225 can be implemented by drilling or etching an opening into interposer 105 that extends from a first planar surface, i.e., the surface to which solder bumps 205 are coupled, through to a second planar surface, i.e., the surface to which solder bumps 220 are coupled. Conductive material then can be deposited within TSVs 225. Examples of conductive material that can be used to fill TSVs 225 can include, but are not limited to, copper, aluminum, gold, copper, nickel, various silicides, and/or the like. In another example, TSVs 225 can traverse substantially through interposer 105 to couple solder bumps 220 with one or more metal layers as are used to form interconnect 215. Interconnect 215 and one or more conventional vias then can couple TSVs 225 to solder bumps 205.

TSVs 225, in combination with solder bumps 220, couple die 110 to surface 235. As noted, one or more additional process steps can be used to implement active circuit elements within interposer 105. Generally with multi-die IC structures, large sections of the silicon interposer, including portions surrounding interconnect and TSVs, remain unused. In accordance with one or more embodiments disclosed within this specification, active circuit elements such as transistors and diodes can be implemented within unused portions of interposer 105.

Thus, as shown within FIG. 2, the first planar surface of interposer 105 can be physically coupled to dies 110 and 115. The second planar surface of interposer 105 can be physically coupled to surface 235. Each of dies 110 and 115 and surface 235 can be implemented using materials that can have differing coefficients of thermal expansion as compared to interposer 105. As a result, each of interposer 105, dies 110 and 115, and surface 235 can expand at differing rates when exposed to changes in temperature.

When implemented within a system, an IC package that includes interposer 105, dies 110 and 115, and surface 235, can be affected by changes in temperature external to the IC package. In addition, in a powered on state, circuit elements within IC structure 100 can generate heat that can alter the temperature of interposer 105, dies 110 and 115, and surface 235. The changes in temperature can result in continual expansion and contraction of each of interposer 105, dies 110 and 115, and surface 235.

As each of dies 110 and 115 and surface 235 can have a different coefficient of thermal expansion than interposer 105, each can expand and contract at a different rate than interposer 105. With each of dies 110 and 115 and surface 235 being physically coupled to interposer 105, the different rates of expansion and contraction between interposer 105, dies 110 and 115, and surface 235 result in the application of forces to the respective components. These forces can create stress within interposer 105 that can increase in areas surrounding openings through interposer 105, such as TSVs 225.

In addition, the conductive material used to fill TSVs 225 can have a different coefficient of thermal expansion than interposer 105. In that case, the conductive material used to fill each TSV 225 can expand and contract at a different rate than interposer 105. As a result, the conductive material can exert an additional force on interposer 105 from within the TSVs 225, thereby further increasing the stress applied to areas of interposer 105 surrounding TSVs 225.

Figure 3:
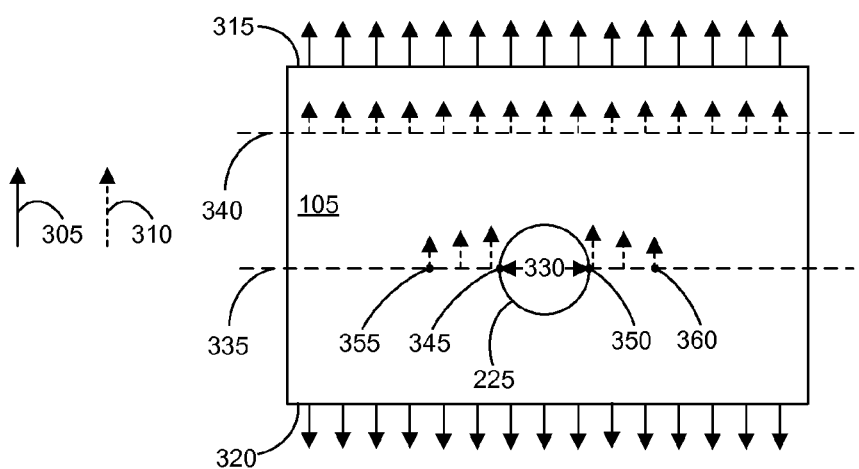
FIG. 3 is a third block diagram illustrating exemplary effects of stress within a multi-die IC structure surrounding a through silicon via (TSV) in accordance with another embodiment disclosed within this specification.

FIG. 3 is a third block diagram illustrating exemplary effects of stress within a multi-die IC interposer surrounding a TSV in accordance with another embodiment disclosed within this specification. More particularly, FIG. 3 illustrates the manner in which forces applied to a multi-die IC interposer, such as interposer 105, can result in the application of stress and the generation of a stress field. FIG. 3 illustrates the manner in which stress is concentrated in the area surrounding a TSV such as TSV 225.

As previously described, physical coupling of interposer 105 to one or more dies and IC packaging can result in the application of forces to interposer 105. The conductive material within TSV 225 also can result in the application of forces to interposer 105. The forces can create stress within the material used to implement interposer 105. In general, this stress is increased in and around areas of interposer 105 that surround any opening through interposer 105, such as TSV 225.

To better illustrate how forces induce a stress field within interposer 105, FIG. 3 depicts a one-dimensional case in which a uni-axial force is applied to interposer 105. In actuality, three-dimensional forces can be applied to interposer 105 that can be oriented along, or between, three orthogonal axes defining the positioning of interposer 105. In this regard, the stress field induced by TSV 225 is not limited to extending outward along line 335, but rather can extend outward in all directions with respect to TSV 225. It should be appreciated that FIG. 3 is not drawn to scale. FIG. 3 is drawn to more clearly illustrate the stress that can be induced surrounding a TSV such as TSV 225.

Referring to FIG. 3, a uni-axial force is applied to interposer 105 along edges 315 and 320. The application of force to interposer 105 generates tensile stress within the material used to implement interposer 105. The force applied to an area of an edge of interposer 105 is illustrated by each of arrows 305. Tensile stress (stress) present within interposer 105 is illustrated by each of arrows 310. The orientation and length of each of arrows 305 demonstrate the direction and magnitude, respectively, of the force applied to edges 315 and 320 of interposer 105. Similarly, the orientation and length of each of arrows 310 demonstrate the direction and magnitude, respectively, of the stress generated within various areas of interposer 105.

When force is applied to interposer 105, any discontinuity in the material, e.g., TSV 225, affects the stress concentration, or stress field, in areas surrounding the discontinuity. As a result, TSV 225 increases stress in areas of interposer 105 surrounding TSV 225. Referring to FIG. 3, TSV 225 is implemented as a circular opening filled with a conductive material and having a diameter 330.

The stress induced by the presence of TSV 225 within interposer 105 is generally concentrated at the edge of the opening for TSV 225 and decreases along line 335 when moving away from TSV 225. In other words, stress is maximized within interposer 105 along an axis symmetrically bisecting TSV 225 perpendicular to the direction of the force applied to interposer 105, i.e., in this case along diameter 330. In general, in areas of interposer 105 parallel to, but above or below diameter 330, stress is distributed in a normalized fashion. For example, the magnitude of the stress along line 340 within interposer 105 has returned to a normalized and evenly distributed stress.

In general, the tensile stress concentration at points 345 and 350 along an edge of TSV 225 can be described by the expression $$\sigma 3 = \sigma 1 \left(1 + \frac{2b}{a}\right).$$

Within the expression for $\sigma 3$, $\sigma 1$ represents the uniform, or average, tensile stress within interposer 105, for example, along line 340. The variable a is the radius of TSV 225 that is parallel to the direction of the force. The variable b is the radius of TSV 225 that is perpendicular to the direction of the force. For a substantially circular TSV such as TSV 225, the length of a is approximately equal to the length of b. Thus, the expression $$\frac{2b}{a}$$

reduces to a value of 2 and $\sigma 3 = 3\sigma 1$. The expression for $\sigma 3$ demonstrates that the tensile stress concentration at points 345 and 350, i.e., $\sigma 3$, is approximately three times the average tensile stress. The phrase "stress concentration factor," generally denoted as $K_t$, can be defined as $K_t = \sigma 3/\sigma 1 = 3$.

The presence of increased stress within interposer 105 can affect the performance of active circuit elements implemented within interposer 105. For example, stress can cause variations in carrier mobility within active circuit elements within interposer 105. Considering that the concentration of stress, referring to the stress field induced by TSV 225, is greater within interposer 105 in the areas surrounding TSV 225 along line 335, the performance of active devices located along line 335 can vary as a consequence of the increased stress concentration induced by TSV 225.

As noted, FIG. 3 illustrates only a uni-axial force applied to interposer 105 along edges 315 and 320. As noted, the actual stress field generated or induced by TSV 225 extends outward in all directions. The concentration of the stress field reduces as one moves farther from TSV 225 until the stress concentration reaches the average tensile stress level. In general, the stress concentration or level reduces at a rate of 1/D, where "D" represents the distance from the perimeter of the TSV 225. For example, the stress level of the stress field induced by TSV 225 reaches the normalized tensile stress level moving away from TSV 225 at points 355 and 360.

Conventional design techniques utilize the concept of a Keep Out Zone (KOZ) to reduce the impact of TSV-induced stress on active circuit elements. A KOZ is typically designated that defines a particular area within a die such as interposer 105 that surrounds a TSV in which active circuit elements are not to be located or implemented in order to avoid stress related performance issues with the active circuit elements. When the number of TSVs increases, however, the many KOZs defined surrounding each TSV can significantly reduce the usable area of a die for implementing active circuit elements. Moreover, the superposition of stress-fields from two or more TSVs can increase the difficulty of eliminating TSV-induced stress completely.

In some cases, the KOZ is defined according to degradation in one or more operating characteristics of an active circuit element such as drive current or the like. In this manner, the KOZ is defined as ending at a perimeter outsize of which the selected operating characteristic of the active circuit element implemented at that location is degraded by a predetermined amount or percentage or not at all (as compared to the case in which no TSV is present). Using measures of degradation in operating characteristics of active circuit elements, however, still can lead to situations in which the TSV-induced stress can affect one active circuit element of a circuit block differently than another active circuit element of a same circuit block.

For example, consider the case of a differential transistor pair. One transistor of the pair can be affected differently than the other transistor of the pair by a given TSV despite both transistors performing within an accepted tolerance range. Similarly, transistors used within pull-up and/or pull-down circuits typically utilized for input/output circuits can be affected differently by a given TSV. As another example, different nodes of a high-performance clock distribution network can be affected differently by one or more TSVs, thereby resulting in variation in performance between the nodes of the high-performance clock distribution network. These variations can lead to situations in which a circuit design is not meeting design goals or where the actual performance of the circuit design, though meeting design goals, operates differently than expected.

In illustration, consider the case in which a circuit design is to be implemented within a multi-die IC structure that includes TSVs and pre-fabricated circuit blocks. Some ICs that include pre-fabricated circuit blocks can be programmed to perform specified functions with one example being a field programmable gate array (FPGA). An FPGA typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs) that can include active circuit elements. The programmable logic circuitry implements the logic of a user design using programmable elements that can include, for example, function generators, registers, arithmetic logic, and so forth, which also can include active circuit elements.

The programmable interconnect circuitry and programmable logic circuitry are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

An FPGA is but one type of programmable IC. Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic. Another type of programmable IC can be an application-specific IC (ASIC) that includes programmable circuitry.

In any case, it should be appreciated that the presence of TSVs within a programmable IC can cause two identical circuit blocks to function differently simply due to the location of each respective circuit block in relation to one or more TSVs and the stress field generated by each such TSV. This differing, or non-uniform, performance of like or same circuit blocks can be problematic for circuit designers and make reliably implementing a circuit design within a multi-die programmable IC difficult.

The stress field induced by a TSV, or more than one TSV, can be determined using any of a variety of different techniques. In one aspect, a global analysis of forces and resulting stresses can be performed for a given IC package. Forces can be estimated or measured with the resulting stress fields being developed mathematically. Stress fields can be mathematically modeled, for example, within a single die of the IC package. The macro model developed for the IC package can be applied and subdivided to provide a micro model that is applicable at the individual active circuit element level across a die. The local effects of the stresses across the entire interposer, for example, can be evaluated to estimate the stress field from individual TSVs as applied to one or more different active circuit elements. In one aspect, distance between each active circuit element and TSV can be used to evaluate or determine the stress field to which that active circuit element is subjected as induced by the TSV.

In another aspect, empirical data can be determined for active circuit elements as measured from test structures constructed with various configurations of TSVs and/or active circuit elements. Various operational characteristics of the active circuit element can be measured such as the saturation current of the active circuit element or the like. Measured operational characteristics can be correlated with physical properties of the active circuit element such as, for example, orientation of the active circuit element compared with TSV location, width of the active circuit element, length of the active circuit element, whether the active circuit element is an N-type of device or a P-type of device, or the like. The data measured from actual silicon prototype structures can be used to generate a model that can be used for purposes of IC design simulation and/or optimization.

Figure 4:
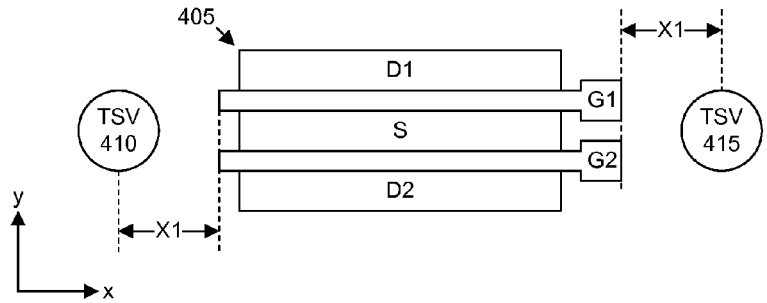
FIG. 4 is a fourth block diagram illustrating a topographical, layout view of a differential transistor pair in accordance with another embodiment disclosed within this specification.

FIG. 4 is a fourth block diagram illustrating a topographical, layout view of a differential transistor pair (differential pair) in accordance with another embodiment disclosed within this specification. A "layout" can refer to a representation of an IC structure, or portion thereof, in terms of planar geometric shapes which correspond to the design masks that pattern the metal layers, the oxide regions, the diffusion areas, or other layers that make up devices of the IC. FIG. 4 illustrates differential pair 405. Differential pair 405 includes a first transistor and a second transistor. The first transistor is formed of a drain D1, a gate G1, and a source S that is shared with the second transistor. The second transistor of differential pair 405 is formed of a drain D2, a gate G2, and the source S.

Differential pair 405 is located between two TSVs 410 and 415. For purposes of illustration, TSV 410 and TSV 415 can be implemented with a substantially similar, or same, shape and can be sized substantially the same. For example, when implemented as circular TSVs, TSV 410 and TSV 415 can have substantially equivalent diameters. A two-dimensional coordinate system is illustrated for reference. Components such as TSVs 410 and 415, drains D1 and D2, source S, and gates G1 and G2 can, for example, be assigned coordinates of the form (x, y) corresponding to the two-dimensional coordinate system shown.

As shown, TSV 410 is located a distance of X1 from differential pair 405. Because TSV 410 is substantially aligned with source S, e.g., with the center of TSV 410 being aligned with a center of source S on the y-axis, TSV 410 is equidistant from the first and the second transistors of differential pair 405. Accordingly, each of the first and second transistors of differential pair 405 is exposed to the same stress field as induced by TSV 410. In this regard, the stress field to which the first transistor is exposed is matched with the stress field to which the second transistor is exposed as induced by TSV 410.

Similarly, TSV 415 is located the distance of X1 from differential pair 405. TSV 415 is substantially aligned with source S and, therefore, equidistant from the first transistor and the second transistor of differential pair 405. Accordingly, each of the first and second transistors of differential pair 405 is exposed to the same stress field as induced by TSV 415. In this regard, the stress field to which the first transistor is exposed is matched with the stress field to which the second transistor is exposed as induced by TSV 415.

The first and second transistors of differential pair 405 remain matched in that each transistor is likely to be degraded by stress effects induced from TSVs 410 and 415 in substantially the same way and in substantially the same amount. Thus, presuming that the first transistor and the second transistor have matching physical characteristics in terms of sizing and the like, each can be expected to perform in a same or similar manner, e.g., have same or similar operating characteristics, despite the presence of TSVs 410 and 415. Both the first transistor and the second transistor of transistor pair 405 continue to be matched despite the presence and/or proximity of TSVs 410 and 415.

In an embodiment, the particular type of signal carried by a TSV can be disregarded in terms of the stress field induced by that TSV. Referring again to FIG. 4, for example, TSV 410 can carry or be coupled to a signal of a circuit design, a voltage supply, or ground. The stress field induced by TSV 410 can be determined as described within this specification without regard to whether TSV 410 is coupled to a signal, a power supply, or ground.

For purposes of illustration, distance can be measured from the center of each TSV structure. Distance also can be measured from an outer perimeter of each TSV structure if preferred so long as distance measurements are made in a uniform manner with respect to a given circuit block and the TSV(s) surrounding that circuit block.

It should be appreciated that TSV 410 can be located a different distance from differential pair 405 than TSV 415. In order for each of TSVs 410 and 415 to subject the first and the second transistors of differential pair 405 to matched stress fields, e.g., wherein each transistor of differential pair 405 experiences the same or substantially similar stress effect from each TSV, TSVs 410 and 415 are to be located along the horizontal line bisecting source S.

Figure 5:
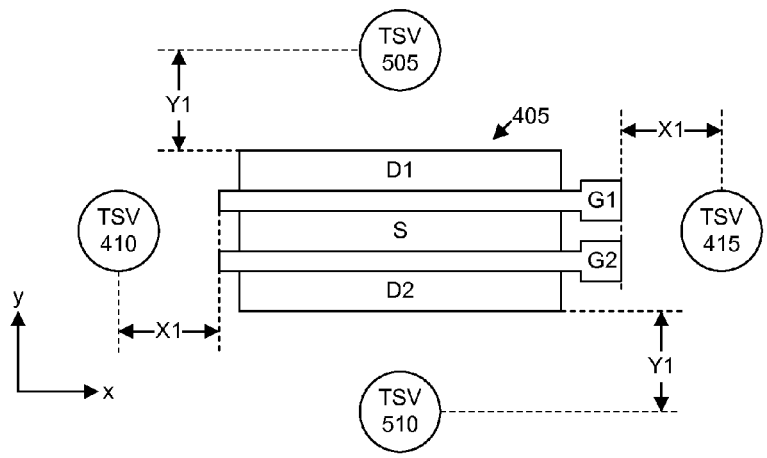
FIG. 5 is a fifth block diagram illustrating a topographical, layout view of a differential transistor pair in accordance with another embodiment disclosed within this specification.

FIG. 5 is a fifth block diagram illustrating a topographical, layout view of a differential transistor pair in accordance with another embodiment disclosed within this specification. More particularly, FIG. 5 illustrates differential pair 405. As shown, each of TSVs 410 and 415 is located a distance of X1 from differential pair 405 as described with reference to FIG. 4.

Due to the positioning of each of TSVs 505 and 510 and the orientation of differential pair 405, each of TSVs 505 and 510 can be aligned with respect to the x-axis, e.g., have a same x-coordinate. In addition, TSV 505 is located a distance of Y1 from an edge of differential pair 405. Similarly, a TSV 510 is located a same distance of Y1 from an edge of differential pair 405. It should be appreciated that by implementing the first and second transistors of differential pair 405 as matched active circuit elements, TSV 505 and TSV 510 can be equidistant from a horizontal line with a y-coordinate that substantially bisects source S. Each of TSVs 410, 415, 505, and 510 can be shaped substantially the same and can be sized substantially the same.

TSVs 505 and 510 are equidistant from source S of the first and second transistors forming differential pair 405. Due to the orientation of differential pair 405, TSV 505 and TSV 510 must be located the same distance from the source S of differential pair 405 unlike TSVs 410 and 415, which can be located different distances from differential pair 405. TSV 505 can induce greater stress on the first transistor than the second transistor due to the closer proximity of TSV 505 to the first transistor, e.g., closer proximity to D1 than D2. TSV 510 can induce greater stress on the second transistor than the first transistor due to the closer proximity of TSV 510 to the second transistor, e.g., closer proximity to D2 than D1. When TSV 505 and 510 are equidistant to source S of differential pair 405 as shown, the super-positioning or combination of stress fields generated by TSV 505 and TSV 510 result in both the first transistor and the second transistor of differential pair 405 being exposed to the same or a matched stress field. Were TSV 505 to be located a different distance from differential pair 405 than TSV 510, the combination of stress fields induced by TSV 505 and TSV 510 would not combine to result in a matched stress field. The first transistor would be exposed to a different stress field from TSVs 505 and 510 than the second transistor, thereby resulting in unmatched operating characteristics of the active circuit elements forming differential pair 405.

Accordingly, using the TSV positioning illustrated in FIG. 5, the stress field induced by each of TSVs 505 and 510 has a same effect upon the first and second transistors of differential pair 405. The first transistor is subjected to the same stress field as induced by each of TSVs 410, 415, 505, and 510 as the second transistor. Accordingly, like the example presented in FIG. 4, presuming that the first transistor and the second transistor have matching physical characteristics, each can be expected to perform in a same or similar manner despite the presence of TSVs 410, 415, 505, and 510.

Figure 6:
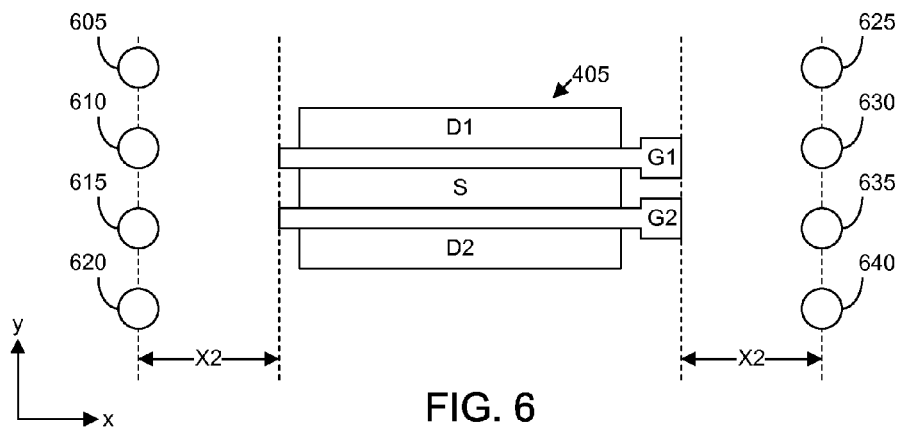
FIG. 6 is a sixth block diagram illustrating a topographical, layout view of a differential transistor pair in accordance with another embodiment disclosed within this specification.

FIG. 6 is a sixth block diagram illustrating a topographical, layout view of a differential transistor pair in accordance with another embodiment disclosed within this specification. More particularly, FIG. 6 illustrates differential pair 405 disposed between a first column of TSVs 605-620 and a second column of TSVs 625-640. In the embodiment illustrated in FIG. 6, each of TSVs 605-620 can be aligned and have a same y-coordinate. Similarly, each of TSVs 625-640 can be aligned and have a same y-coordinate. Further, each of TSVs 605-640 can be shaped substantially the same and can be sized substantially the same.

In terms of spacing along the vertical axis, TSV 610 and TSV 615 can be equidistant from a horizontal line with a y-coordinate that substantially bisects source S. TSV 605 and TSV 620 can be equidistant from the horizontal line bisecting source S. TSV 630 and TSV 635 can be equidistant from the horizontal line bisecting source S. TSV 625 and TSV 640 can be equidistant from the horizontal line bisecting source S.

In another example, TSVs 605-620 can be equally spaced. Similarly, TSVs 625-640 can be equally spaced. It should be appreciated, however, that this need not be the case so long as the equidistant spacing of TSV pairs is maintained as described with reference to the horizontal line bisecting source S. Moreover, as shown, the column of TSVs 605-620 can be located a distance of X2 from differential pair 405. The column of TSVs 625-640 can be located a same distance of X2, or a different distance as discussed with reference to FIG. 4, from differential pair 405 while maintaining the matching stress fields desired.

With the alignment and positioning shown, the resulting stress field induced by each of TSVs 605-640 affects the first transistor and the second transistor of differential pair 405 in the same manner. In this regard, the stress field to which each transistor of differential pair 405 is subjected, as induced by TSVs 605-640, is matched. When the first transistor and the second transistor are formed with matching physical properties, each is degraded in the same or similar manner so as to maintain the matching operational characteristics in the presence of TSVs 605-640.

The embodiments illustrated with respect to FIGS. 4-6 show various examples in which TSVs are positioned to affect each of the active circuit elements of a circuit block in the same or substantially similar manner. In this regard, the stress field to which a first active circuit element of a circuit block is exposed, as induced by one or more TSVs, is the same as or matches the stress field to which a second active circuit element of the circuit block is exposed. Accordingly, the first and the second active circuit elements can remain matched despite the influence of one or more stress fields induced by one or more respective TSVs.

As illustrated with reference to FIGS. 4-6, distance and symmetry can be used as proxies for determining that stress fields induced by TSVs on active circuit elements are matched. For instance, TSVs can be positioned to be located equivalent distances from the individual active circuit elements of the circuit block that are to be matched. In another example, TSVs can be positioned to be symmetric about a circuit block. In some cases, the location of a common centroid of the TSVs, for example, can be the same as the location of a centroid of the circuit block. For example, referring to any of FIGS. 4-6, the TSVs can be positioned so that all TSVs illustrated within each respective one of FIGS. 4-6 are symmetric with respect to the circuit block and/or have a centroid that is common with the centroid of the circuit block illustrated.

A "centroid" can refer to an intersection point of an axis of symmetry parallel to the x-axis with an axis of symmetry parallel to the y-axis for a given circuit structure such as a circuit block or two or more TSVs. Each axis of symmetry can represent a dividing line separating the active surface area, or the surface area, of two or more circuit elements (e.g., forming a circuit block) into equal and symmetric halves existing on either side of the axis of symmetry.

With respect to a differential pair, symmetry can have a significant effect upon performance of the circuit block. TSV to transistor distance can be a significant part of the symmetry determination. For a given multi-die IC structure, a TSV generally has a fixed diameter. With diameter of the TSV being fixed, IC designers are left with varying the distance of TSVs to active circuit elements and using symmetry to achieve uniform exposure of active circuit elements to stress fields across the circuit block.

Other factors such as the relative ratio of TSV size to transistor size can affect the concentration of stress within the stress field that is induced. As noted, the stress induced by a TSV drops a rate of approximately 1/D when moving away from the TSV. Consider the case of a small transistor that is located a small distance D from a large TSV. The TSV likely induces largely uniform stress across the entirety of the transistor despite the drop off in stress of 1/D. By comparison, when a larger transistor is located the same distance D from a smaller TSV, the TSV likely induces non-uniform stress across the entirety of the transistor.

Referring to FIG. 5, for example, when smaller transistors are utilized in conjunction with relatively larger TSVs, the vertical spacing denoted as Y1 between differential pair 405 and TSV 505 or TSV 510 can differ without resulting in significant mismatch between the stress fields to which each transistor is exposed. Alternatively, with a minimum ratio of TSV diameter to device size, e.g., channel length of the transistor, a single TSV can be located above or below differential pair 405 without the need for a counter-balancing TSV located opposite. For example, either one of TSVs 505 or 510 can be included without the other.

Figure 7:
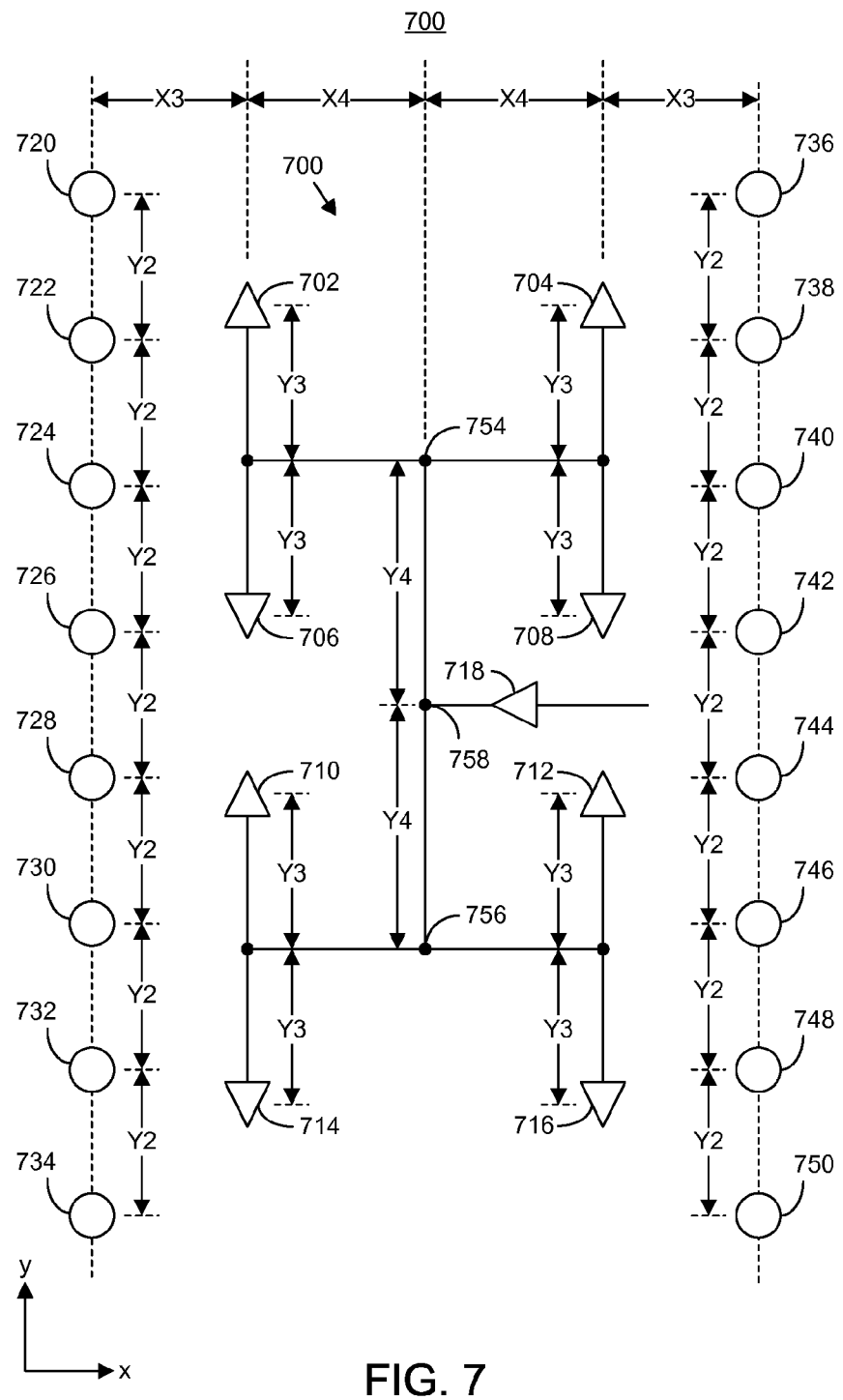
FIG. 7 is a seventh block diagram illustrating a topographical, layout view of a clock network in accordance with another embodiment disclosed within this specification.

FIG. 7 is a seventh block diagram illustrating a topographical, layout view of a clock distribution network in accordance with another embodiment disclosed within this specification. FIG. 7 illustrates a clock distribution network (clock network) 700 type of circuit block that includes nodes 702-718 arranged in an "H" type of pattern. Clock network 700 can be implemented as a high-performance clock network in which each branch is configured to have matching delay characteristics in terms of clock signal distribution. For example, the signal propagation delay as measured from node 718 to each one of nodes 702-716 individually can be substantially equivalent. For purposes of illustration, each of nodes 702-718 can represent a buffer circuit block or clock signal driver circuit block having one or more active circuit elements.

In this regard, nodes 702, 706, 710, and 714 can be aligned vertically in a column where each of nodes 702, 706, 710, and 714 has a same x-coordinate. Similarly, nodes 704, 708, 712, and 716 can be aligned vertically in a column where each of nodes 704, 708, 712, and 716 has a same x-coordinate. Nodes 702 and 706 can be equidistant from the horizontal clock network distribution line through the point labeled 754. Each of nodes 702 and 706 is depicted as being located a vertical distance of Y3 from the line through point 754. Nodes 704 and 708 can be equidistant from the horizontal clock network distribution line through point 754. Each of nodes 704 and 708 is depicted as being located a vertical distance of Y3 from the line through point 754.

Similarly, nodes 710 and 714 can be equidistant from the horizontal clock network distribution line through the point labeled 756. Each of nodes 710 and 714 is depicted as being located a vertical distance of Y3 from the horizontal clock network distribution line through point 756. Nodes 712 and 716 can be equidistant from the horizontal clock network distribution line through point 756. Each of nodes 712 and 716 is depicted as being located a vertical distance of Y3 from the horizontal clock network distribution line through point 756.

Each of the lines through points 754 and 756 can be equidistant from the horizontal clock network distribution line through point 758. As shown, each of the lines through points 754 and 756 is shown as being located a vertical distance of Y4 from point 758. The column of nodes formed of nodes 702, 706, 710, and 714 can be located a distance of X4 from the vertical axis defined by points 754, 756, and 758. Similarly, the column of nodes formed of nodes 704, 708, 712, and 716 can be located a distance of X4 from the vertical axis defined by points 754, 756, and 758.

In this regard, a first column of TSVs 720-734 can be vertically aligned so that each of TSVs 720-734 has a same x-coordinate. Each consecutive pair of TSVs of the first column of TSVs 720-734 can be separated by a vertical distance of Y2. Similarly, a second column of TSVs 736-750 can be vertically aligned so that each of TSVs 736-750 has a same x-coordinate. Each consecutive pair of TSVs of the second column of TSVs 736-750 can be separated by the same vertical distance Y2.

In addition, TSVs 726 and 728 can be positioned to be equidistant from a horizontal line through point 758. Similarly, TSVs 742 and 744 can be equidistant from the horizontal line through point 758. The column of TSVs 720-734 can be separated from the column of nodes formed of nodes 702, 706, 710, and 714 by a distance of X3. The column of TSVs 736-750 can be separated from the column of nodes formed of nodes 704, 708, 712, and 716 by the distance of X3.

By positioning TSVs in a way that preserves substantial symmetry with regard to clock distribution network 700, or other circuit blocks for that matter, the effects of induced stress from each of TSVs 720-750 can be applied uniformly across nodes 702-716 of clock distribution network 700. Appreciably, node 718 is affected more by the column of TSVs 736-750 than by the column of TSVs 720-734 as the effects of stress decrease from the TSV at a rate of approximately 1/D.

In many real-world cases, the clock distribution network is not implemented in a symmetric shape as shown in FIG. 7. Modern ICs, including programmable ICs, for example, can include various circuit blocks such as processors, DSPs, memories, and the like that disrupt the grid-like layout of a given interposer or die, thereby preventing the clock distribution network from being implemented in a symmetric pattern. In such cases, the asymmetry of the clock distribution network can result in different distances between TSVs and nodes of the clock network resulting in different stress fields, and thus, different stress levels, being applied to the nodes. The differing stress fields can result in different delays within the clock network due to the varied performance of transistors therein.

In some cases, one or more additional TSVs can be added to the layout of the die. A TSV that is added to the layout of a die for purposes of matching stress profiles surrounding active circuit elements can be referred to as a "dummy TSV." A dummy TSV can be a TSV that is coupled to either a power supply or to ground. A dummy TSV, for example, is not one that carries a signal of the circuit design, e.g., data. One or more dummy TSVs can be added to, and positioned within, the layout of a die so that the stress fields of the TSVs of a selected region are superimposed with the stress field induced by the dummy TSV. The dummy TSV, or dummy TSVs as the case may be, can be positioned so that selected active circuit elements within the circuit block are exposed to the same, e.g., matching, stress fields referring to the superimposed stress fields of the TSVs and dummy TSV(s).

FIGS. 4-7 illustrate various techniques for positioning TSVs on a die or interposer with respect to circuit blocks. TSVs can be relocated to achieve the various configurations illustrated, whether measured in terms of distance to active circuit elements, symmetry, or a combination of both. Further, additional dummy TSVs can be added to achieve the sort of configurations shown.

Figure 8:
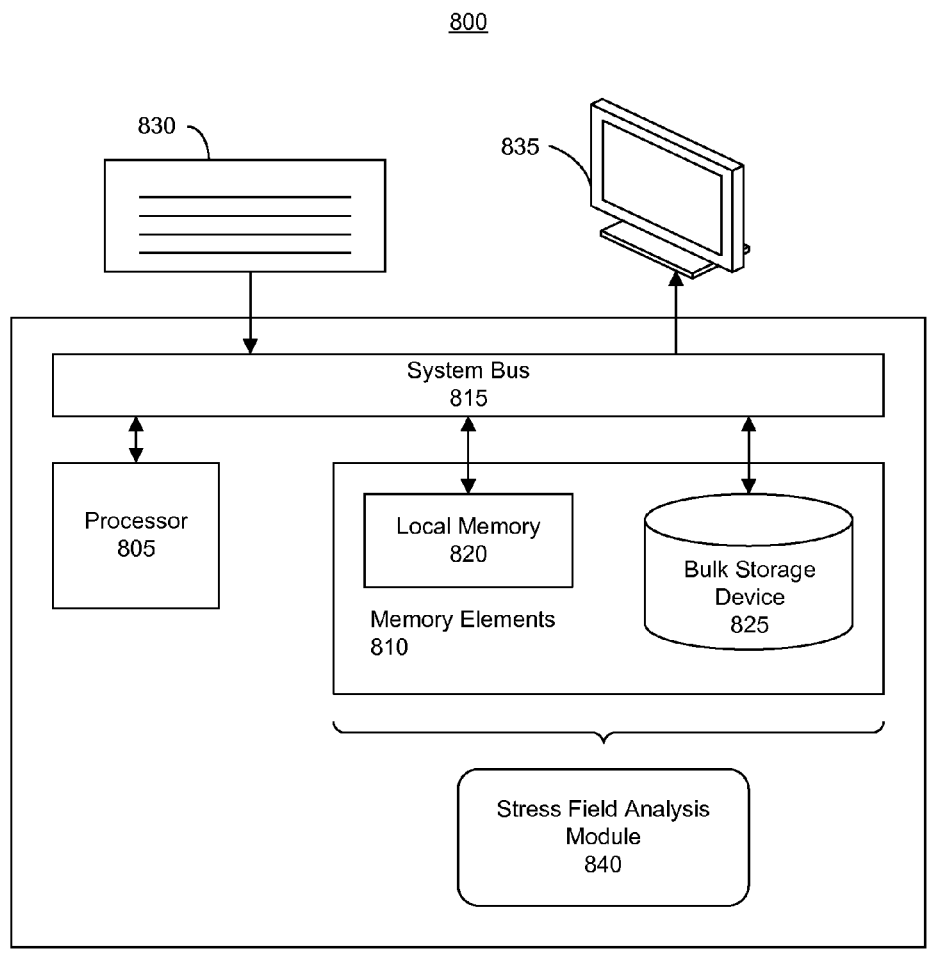
FIG. 8 is an eighth block diagram illustrating an exemplary computing system in accordance with another embodiment disclosed within this specification.

FIG. 8 is an eighth block diagram illustrating an exemplary computing system (system) 800 in accordance with another embodiment disclosed within this specification. System 800 can include at least one processor 805 coupled to memory elements 810 through a system bus 815. As such, system 800 can store program code within memory elements 810. Processor 805 can execute the program code accessed from memory elements 810 via system bus 815. In one aspect, for example, system 800 can be implemented as a computer that is suitable for storing and/or executing program code. It should be appreciated, however, that system 800 can be implemented in the form of any system having a processor and memory that is capable of performing the functions described within this specification.

Memory elements 810 can include one or more physical memory devices such as, for example, local memory 820 and one or more bulk storage devices 825. Local memory 820 refers to random access memory or other non-persistent memory device(s) generally used during actual execution of the program code. Bulk storage device(s) 825 can be implemented as a hard drive or other persistent data storage device. System 800 also can include one or more cache memories (not shown) that provide temporary storage of at least some program code in order to reduce the number of times program code must be retrieved from bulk storage device 825 during execution.

Input/output (I/O) devices such as a keyboard 830, a display 835, and a pointing device (not shown) optionally can be coupled to system 800. The I/O devices can be coupled to system 100 either directly or through intervening I/O controllers. Network adapters also can be coupled to system 800 to enable system 800 to become coupled to other systems, computer systems, remote printers, and/or remote storage devices through intervening private or public networks. Modems, cable modems, and Ethernet cards are examples of different types of network adapters that can be used with system 800.

As pictured in FIG. 1, memory elements 810 can store a stress field analysis module 840. Stress field analysis module 840, being implemented in the form of executable program code, can be executed by system 800. Stress field analysis module 840 can determine stress fields induced by various TSVs as applied to individual active devices within a given die or interposer. In another example, stress field analysis module 840 can determine or model active devices, e.g., formulate spice models, for active circuit elements that depend upon distance to TSVs and the stress fields generated by the TSVs.

Figure 9:
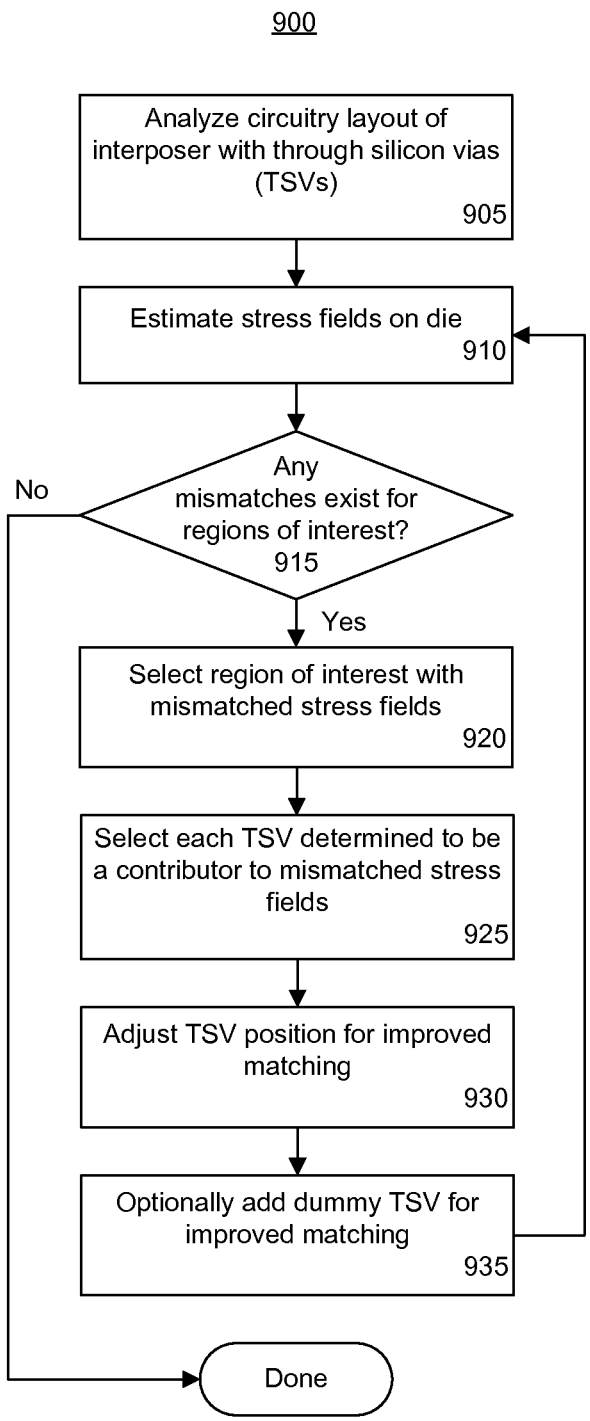
FIG. 9 is a flow chart illustrating a method of designing an IC using TSVs in accordance with another embodiment disclosed within this specification.

FIG. 9 is a flow chart illustrating a method 900 of designing an IC using TSVs in accordance with another embodiment disclosed within this specification. Method 900 can be performed by a data processing system such as the system illustrated in FIG. 8 using the various rules and techniques described with reference to FIGS. 1-7.

Method 900 can begin in step 905, where the system can analyze the circuitry layout of an interposer, e.g., a die, with one or more TSVs implemented therein. For example, the system can determine distances from active circuit elements to TSVs, e.g., nearest TSVs or TSVs within a predetermined distance of each active circuit element within which the stress field of that TSV is presumed to have an effect upon the performance of the active circuit element. The system also can identify regions of interest such as differential pairs, clock distribution networks, or other circuit structures in which matching active circuit elements are utilized.

In step 910, the system can estimate the stress fields on the die. The system can estimate the stress fields generated by the various TSVs and superimpose the stress fields that overlap to develop a stress profile across the interposer thereby allowing a correlation of stress field to individual circuit blocks and individual active circuit elements.

In step 915, the system can determine whether any mismatches exist for regions of interest. As discussed, a mismatch refers to the situation in which at least two active circuit elements intended to be matched, e.g., physically substantially the same or identical, and intended function with one another are exposed to different stress fields. The two active circuit elements typically are located within a same circuit block and, therefore, are within a predetermined distance of one another if not immediately adjacent to one another. For example, a mismatch can be identified or determined when one circuit element is exposed to a stress level that differs from the stress level to which the other circuit element is exposed by more than a minimum amount of stress.

As discussed, other techniques for determining mismatch in stress fields can include, for example, determining whether a circuit block is symmetric with respect to one or more surrounding TSVs or TSVs within a predetermine range or distance of each active circuit element of the circuit block. Another technique can include determining distance between TSVs and active circuit elements of the circuit block. For example, the system can determine whether one or more or all TSVs within a predetermined distance of the circuit block are located a same distance from each active circuit element. The degree of asymmetry or the magnitude of distance can be correlated with magnitude of the stress field for purposes of comparison and determination of whether stress fields are mismatched. As noted, the stress decreases at a rate of 1/D from each TSV, for example.

In step 920, the system can select a region of interest identified as having a mismatch. In step 925, the system can select each TSV that is determined to be a contributor to, e.g., at least partially induce, the mismatching stress fields to which the active circuit elements of the region of interest are exposed.

In general, mismatch between stress fields can be reduced by modifying a layout of the die for a TSV. For example, in step 930, the system can adjust the position of at least one of the TSVs selected in step 925. The system can relocate a TSV in an attempt to achieve improved or greater matching between the unmatched stress fields. In step 935, the system optionally can modify layout by add a dummy TSV. Adding a dummy TSV can induce a further stress field to be superimposed upon the existing stress fields in an attempt to achieve improved matching between the unmatched stress fields. For example, when a mismatch greater than a predetermined threshold, e.g., larger than the stress field mismatch amount described in step 915, occurs, the differential between the two stress fields can be determined to be too large to be overcome by relocating a TSV. In such cases, one or more dummy TSVs can be added. As noted, the dummy TSV(s) can be added to achieve symmetry or can be added proximate to one or more selected active circuit elements to influence the stress fields to which such active circuit elements are subjected.

After step 935, method 900 can loop back to step 910 to estimate the stress fields on the die in accordance with any repositioned or relocated TSVs adjusted in step 930 and/or any added dummy TSVs added in step 940.

It should be appreciated that method 900 illustrates an exemplary method of circuit design. In another embodiment, dummy TSVs can be added only after a predetermined number of iterations where one or more TSVs that are repositioned fail to improve matching between the unmatched stress fields by a minimum amount. In another embodiment, one TSV can be selected for iterative relocation or repositioning prior to selecting a different TSV for adjustment. In still another embodiment, TSV selection for repositioning can be performed so that the TSV with the largest contribution to either of the unmatched stress fields is selected prior to TSVs with lesser contributions.

In one aspect, a circuit block can be evaluated in terms of a delta from a normalized performance metric where no TSVs are located in a defined area surrounding the circuit block. Thus, when the performance of the circuit block improves to within a predetermined amount of the metric, adjustment of TSVs can be terminated despite any mismatches between stress fields remaining larger than a desired level or threshold.

The flowcharts in the figures illustrate the architecture, functionality, and operation of possible implementations of systems, methods and computer program products according to one or more embodiments disclosed within this specification. In this regard, each block in the flowcharts can represent a module, segment, or portion of code, which includes one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments can be realized in hardware or a combination of hardware and software. One or more embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments further can be embedded in a device such as a computer program product, which comprises all the features enabling the implementation of the methods described herein. The device can include a data storage medium, e.g., a non-transitory computer-usable or computer-readable medium, storing program code that, when loaded and executed in a system comprising memory and a processor, causes the system to perform at least a portion of the functions described within this specification. Examples of data storage media can include, but are not limited to, optical media, magnetic media, magneto-optical media, computer memory such as random access memory, a bulk storage device, e.g., hard disk, or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An integrated circuit (IC) structure, comprising:
a silicon wafer;
a plurality of first circuit elements implemented on the silicon wafer;
a plurality of second circuit elements implemented on the silicon wafer;
a plurality of first through silicon vias (TSVs) extending from a first surface of the silicon wafer to a second surface of the silicon wafer; and
a plurality of second TSVs extending from the first surface of the silicon wafer to the second surface of the silicon wafer,
wherein the first and second circuit elements and the first and second TSVs together comprise a circuit block configuration;
wherein the circuit block configuration is symmetric with respect to at least one axis of symmetry; and
wherein at least one of the first TSVs is a dummy TSV without which the circuit block configuration would not be symmetric, and the dummy TSV and one of the second plurality of TSVs are equidistant from one of the first plurality of circuit elements.

2. The IC structure of claim 1, wherein:
the plurality of first circuit elements and the plurality of second circuit elements include at least a first active circuit element; and
a distance between the dummy TSV and the first active circuit element is sufficiently small that the dummy TSV contributes to the stress field of the first active element.

3. The IC structure of claim 1, wherein:
the first circuit element includes at least a first active circuit element;
the second circuit element includes at least a second active circuit element; and
wherein a stress field to which the first active circuit element is exposed and a stress field to which the second active circuit element is exposed are substantially the same due to the presence of the dummy TSV.

4. The IC structure of claim 3, wherein the first active circuit element and the second active circuit element together comprise a differential transistor pair.

5. The IC structure of claim 3, wherein the first active circuit element and the second active circuit element are coupled to different nodes of a high-performance clock distribution network.

6. The IC structure of claim 1, wherein the location of a centroid of the first and second pluralities of TSVs is the same as the location of a centroid of the circuit block configuration.

7. The IC structure of claim 1, wherein the circuit block configuration is symmetric with respect to two axes of symmetry.

8. The IC structure of claim 1, wherein the IC structure comprises an interposer.

* * * * *